(12) United States Patent
Wu et al.

(10) Patent No.: US 9,214,258 B2
(45) Date of Patent: *Dec. 15, 2015

(54) SEMICONDUCTOR COMPOSITES COMPRISING CARBON NANOTUBES AND DIKETOPYRROLOPYRROLE-THIOPHENE BASED COPOLYMERS

(71) Applicant: XEROX CORPORATION, Norwalk, CT (US)

(72) Inventors: Yiliang Wu, Oakville (CA); Anthony James Wigglesworth, Oakville (CA); Ping Liu, Mississauga (CA)

(73) Assignee: XEROX CORPORATION, Norwalk, CT (US)

( * ) Notice: Subject to any disclaimer, the term of this patent is extended or adjusted under 35 U.S.C. 154(b) by 244 days.

This patent is subject to a terminal disclaimer.

(21) Appl. No.: 13/706,836

(22) Filed: Dec. 6, 2012

(65) Prior Publication Data

US 2014/0158946 A1 Jun. 12, 2014

(51) Int. Cl.
| | |
|---|---|
| *H01B 1/24* | (2006.01) |
| *H01L 51/00* | (2006.01) |
| *H01L 51/05* | (2006.01) |
| *B82Y 30/00* | (2011.01) |

(52) U.S. Cl.
CPC .............. *H01B 1/24* (2013.01); *H01L 51/0545* (2013.01); *B82Y 30/00* (2013.01); *Y10S 977/742* (2013.01); *Y10S 977/75* (2013.01); *Y10S 977/784* (2013.01); *Y10S 977/932* (2013.01); *Y10S 977/936* (2013.01)

(58) Field of Classification Search
CPC .................................................. H01L 51/0545
USPC .............. 257/40; 252/511; 528/163, 216, 117
See application file for complete search history.

(56) References Cited

U.S. PATENT DOCUMENTS

| | | | |
|---|---|---|---|
| 7,910,684 B2 | 3/2011 | Li | |
| 7,928,181 B2 | 4/2011 | Li | |
| 7,928,433 B2 | 4/2011 | Li | |
| 7,932,344 B2 | 4/2011 | Li | |
| 8,158,744 B1 | 4/2012 | Wu et al. | |
| 8,441,002 B2 * | 5/2013 | Murase et al. | 257/40 |
| 8,598,299 B2 * | 12/2013 | Wu et al. | 528/163 |
| 2009/0065766 A1 * | 3/2009 | Li | 257/40 |
| 2009/0065878 A1 * | 3/2009 | Li | 257/411 |
| 2009/0140237 A1 * | 6/2009 | Wu et al. | 257/40 |
| 2009/0166591 A1 * | 7/2009 | Hatton et al. | 252/510 |
| 2010/0102299 A1 * | 4/2010 | Murase et al. | 257/40 |
| 2010/0117034 A1 * | 5/2010 | Han et al. | 252/510 |
| 2012/0187380 A1 | 7/2012 | Wu | |

* cited by examiner

*Primary Examiner* — Gregory R Delcotto
(74) *Attorney, Agent, or Firm* — Pillsbury Winthrop Shaw Pittman LLP

(57) ABSTRACT

A semiconductor composition includes a semiconducting polymer containing a diketopyrrolopyrrole (DKPP) moiety and carbon nanotubes dispersed into the semiconducting polymer. An electronic device contains a semiconductor layer including a semiconductor composition having a semiconducting polymer including a diketopyrrolopyrrole (DKPP) moiety and carbon nanotubes dispersed into the semiconducting polymer. A semiconductor composition contains a semiconducting polymer including a diketopyrrolopyrrole (DKPP) moiety, a solvent selected from the group consisting of tetrachloroethane, dichlorobenzene, chlorobenzene, chlorotoluene, and a mixture thereof, and a carbon nanotube.

18 Claims, No Drawings

SEMICONDUCTOR COMPOSITES COMPRISING CARBON NANOTUBES AND DIKETOPYRROLOPYRROLE-THIOPHENE BASED COPOLYMERS

TECHNICAL FIELD

The present disclosure is generally related to thin-film transistors (TFTs) and/or other electronic devices comprising a semiconducting layer, and more specifically, to semiconductor compositions, as well as electronic devices comprising such compositions, and methods of making such compositions.

BACKGROUND

TFTs generally include a substrate containing an electrically conductive gate electrode, source and drain electrodes, an electrically insulating gate dielectric layer separating the gate electrode from the source and drain electrodes, and a semiconducting layer in contact with the gate dielectric layer and bridging the source and drain electrodes. TFTs are the key elements of integrated circuits (ICs), and the performance of TFTs may be determined by the field effect mobility and the current on/off ratio of the overall transistor. High mobility and high on/off ratios are desired.

Organic thin-film transistors (OTFTs) may be used in applications, such as radio frequency identification (RFID) tags and backplane switching circuits for displays, such as signage, readers, and liquid crystal displays, where high switching speeds and/or high density are not essential. OTFTs also have attractive mechanical properties, such as being physically compact, lightweight, and flexible.

OTFTs may be fabricated using low-cost solution-based patterning and deposition techniques, such as spin coating, solution casting, dip coating, stencil/screen printing, flexography, gravure, offset printing, ink-jet printing, micro-contact printing, and the like. The use of these solution-based processes in fabricating TFT circuits requires solution processable materials. However, organic or polymeric semiconductors formed by solution processing tend to suffer from limited solubility, air sensitivity, and especially low field-effect mobility. This poor performance may be attributable to the poor film-forming nature of small molecules.

Although the last two decades have seen a dramatic increase in mobility for printable organic semiconductors, such as polythiophenes and polythiophene derivatives, there is a continuous need for improving the mobility of semiconductors for broad applications.

SUMMARY

The present disclosure provides a semiconductor composition comprising a carbon nanotube (CNT) dispersed in a semiconducting polymer comprising a diketopyrrolopyrrole (DKPP) moiety.

The present disclosure also provides an electronic device comprising a semiconductor composition comprising a CNT dispersed in a semiconducting polymer comprising a DKPP moiety.

The present disclosure additionally provides a semiconductor composition comprising a semiconducting polymer containing a DKPP moiety; a solvent selected from the group consisting of tetrachloroethane, dichlorobenzene, chlorobenzene, chlorotoluene, and a mixture thereof; and a carbon nanotube.

EMBODIMENTS

The present disclosure provides a semiconductor composition comprising CNTs dispersed in a semiconducting polymer containing a DKPP moiety, resulting in a semiconductor material having a number of advantages over semiconducting materials containing only a semiconducting polymer containing a DKPP moiety, without CNTs.

For example, dispersing CNTs into the semiconducting polymer increases the electric performance, such as the field effect mobility and mechanical strength, of a semiconductor material containing the semiconductor composition. Additionally, a device containing the semiconductor composition having CNTs dispersed in a semiconducting polymer has a reduced contact resistance at the semiconductor layer/electrode interface.

As used herein, the modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range "from about 2 to about 4" also discloses the range "from 2 to 4.

Semiconductor Polymers

Suitable semiconductor materials include a semiconducting polymer of Formula (I):

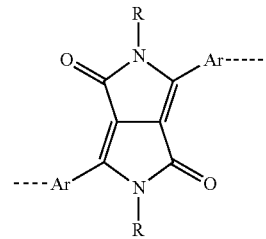

Formula (I)

wherein each R is independently selected from hydrogen, a hydrocarbon, such as alkyl or aryl, and a hetero-containing group, such as heteroaryl; each Ar is independently aryl or heteroaryl; and each Ar may be a terminal group or not a terminal group. Unless otherwise noted, all alkyl, aryl, and heteroaryl groups disclosed herein may be substituted or unsubstituted.

Suitable structures of monomers, oligomers, and polymers containing the DKPP structure of Formula (I) include the following Formulas (II)-(IV):

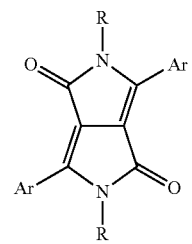

Formula (II)

Formula (III)

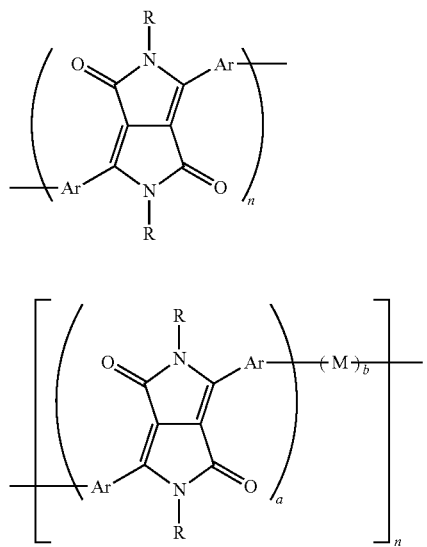

Formula (IV)

wherein each R is independently selected from hydrogen, an optionally substituted hydrocarbon, such as alkyl or aryl, and a hetero-containing group, such as heteroaryl; each Ar is independently selected from optionally substituted aryl and heteroaryl; each M is a conjugated moiety; a is an integer that represents the number of DKPP units and may be at least about 1, such as from about 1 to about 20, from about 1 to about 6, or from about 1 to about 4; b is an integer that represents the number of the conjugated moiety M units and may be from about 0 to about 20, such as from about 1 to about 20, from about 1 to about 6, or from about 1 to about 4; n is an integer that represents the number of repeat units and may be at least about 1, such as at least about 2, from about 2 to about 5000, or from about 10 to about 50; and each repeat unit may be the same moiety or a different moiety.

Suitable Ar groups and suitable conjugated moieties M include:

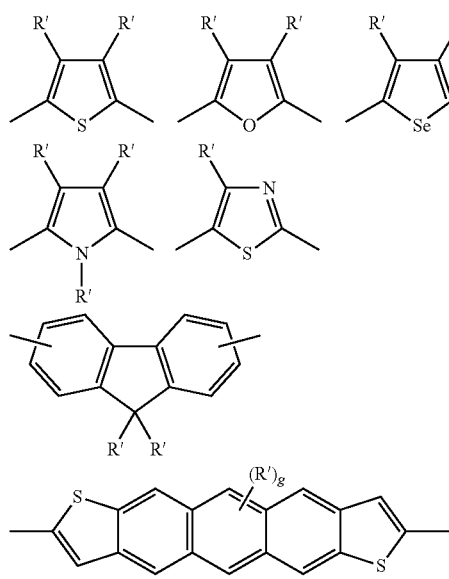

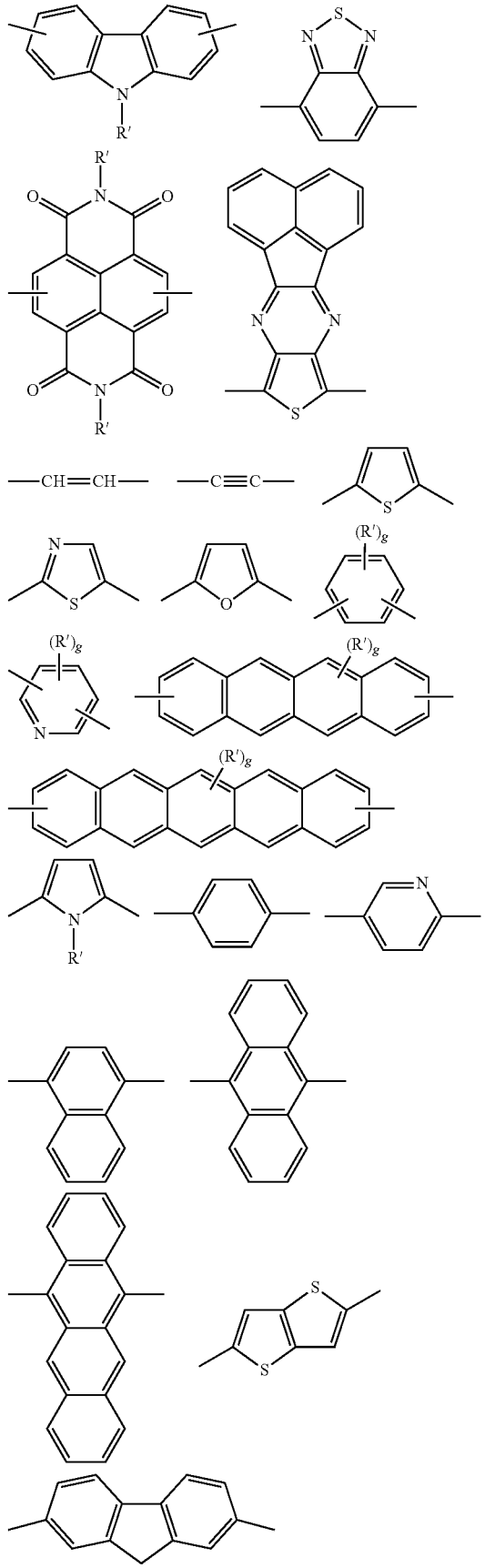

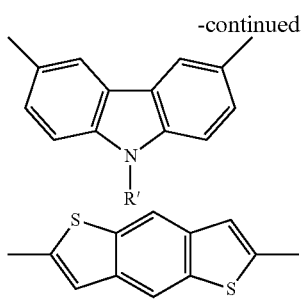

where each R' is independently selected from hydrogen, a hydrocarbon such as alkyl or aryl, a hetero-containing group such as heteroaryl or alkoxy, and a halogen. The conjugated moieties M may be substituted, for example, by replacement of one or more of the hydrogens with an alkyl, aryl, alkylaryl, halogen, or hydroxyl group, combination thereof, or the like.

The term "alkyl" refers to a radical composed entirely of carbon atoms and hydrogen atoms, which is fully saturated. The alkyl radical may be linear, branched, or cyclic. The alkyl radical may be univalent or divalent, i.e., can bond to one or two different non-hydrogen atoms.

The term "aryl" refers to an aromatic radical composed entirely of carbon atoms and hydrogen atoms. When aryl is described in connection with a numerical range of carbon atoms, it should not be construed as including substituted aromatic radicals. For example, the phrase "aryl containing from 6 to 10 carbon atoms" should be construed as referring to a phenyl group (6 carbon atoms) or a naphthyl group (10 carbon atoms) only, and should not be construed as including a methylphenyl group (7 carbon atoms). The aryl radical may be univalent or divalent.

The term "heteroaryl" refers to heterocycles that include an unsaturated ring comprising at least two carbon atoms and at least one atom which is a different atom from carbon, such as S, Se, O, or N. The heteroaryl group may have, for example, about 5 to about 120 atoms, such as from about 6 to about 80 atoms, or from about 10 to about 32 atoms. The heteroaryl group may be an electron-donating group, which assists in hole transport.

The term "substituted" refers to at least one hydrogen atom on the named radical being substituted with another functional group, such as halogen, —CN, —NO$_2$, —COOH, and —SO$_3$H. An exemplary substituted alkyl group is a perhaloalkyl group, wherein one or more hydrogen atoms in an alkyl group are replaced with halogen atoms, such as fluorine, chlorine, iodine, and bromine. Besides the aforementioned functional groups, an alkyl group may also be substituted with an aryl or heteroaryl group. An aryl or a heteroaryl group may also be substituted with alkyl or alkoxy. Exemplary substituted aryl groups include methylphenyl and methoxyphenyl. Exemplary substituted heteroaryl groups include 3-methylthienyl.

Generally, the alkyl groups independently contain from about 1 to about 50 carbon atoms, such as from about 4 to about 36 atoms, or from about 6 to about 32 atoms. Similarly, the aryl groups independently contain from about 6 to about 50 carbon atoms, such as from about 6 to about 36 atoms, or from about 6 to about 18 atoms. The heteroaryl groups contain from about 2 to about 30 carbon atoms, such as from about 5 to about 32 atoms, or from about 5 to about 18 atoms.

Suitable alkyl groups include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, cyclopentyl, cyclohexyl, cycloheptyl, and isomers thereof. The alkyl group is optionally substituted one or more times with, for example, a halogen, such as chlorine, bromine, fluorine, or iodine, or a heteroatom-containing group, or a mixture thereof.

Suitable aryl and substituted aryl groups include phenyl, polyphenyl, and naphthyl; alkoxyphenyl groups, such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl, other aryl groups listed as exemplary M groups, and combinations thereof.

Suitable heteroatom-containing groups include a nitrogen containing moiety, an alkoxy group, a heterocyclic system, an alkoxyaryl, and an arylalkoxy. Suitable heteroatoms include cyano, nitro, methoxyl, ethoxyl, and propoxyl. The heteroatom containing groups may have from about 2 to about 120 atoms, such as from about 2 to about 80 atoms, or from about 5 to about 50 atoms.

Suitable heteroaryl groups include oxazole, isoxazole, pyridine, thiazole, isothiazole, imidazole, triazole, pyrazole, furazan, thiadiazole, oxadiazole, pyridazine, pyrimidine, pyrazine, indole, isoindole, indazole, chromene, quinoline, isoquinoline, cinnoline, quinazoline, quinoxaline, naphthylidine, phthalazine, purine, pteridine, thienofuran, imidazothiazole, benzofuran, benzothiophene, benzoxazole, benzthiazole, benzthiadiazole, benzimidazole, imidazopyridine, pyrrolopyridine, pyrrolopyrimidine, pyridopyrimidine, and combinations thereof. The heteroaryl group may include a five-membered unsaturated ring comprising a single heteroatom, such as S, Se, O, or N, in the form of NR", where R" is as defined for R in Formulas (I)-(IV) above, and is bonded to the respective fused ring of the DKPP moiety by this five-membered unsaturated ring.

For example, Formula (V) represents a compound according to Formula (IV) in which Ar comprises an optionally substituted five-membered heterocycle:

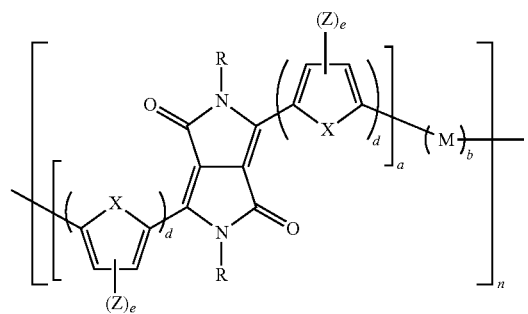

(V)

where each X is independently a heteroatom, for example, S, Se, O, or NR", each R is as previously defined and each R" is as defined for R in Formulas (I)-(IV) above. For example, R or R" may be hydrogen, an optionally substituted hydrocarbon such as alkyl or aryl, or a hetero-containing group such as heteroaryl. Each Z is independently an optionally substituted hydrocarbon such as alkyl or aryl, a hetero-containing group such as CN, heteroaryl, or a halogen such as Br, Cl, or F; d is an integer that is at least about 1, such as from 1 to about 10, or from about 1 to about 6; e is an integer that represents the number of Z and may be from about 0 to about 2, such as 0, 1, or 2; and R, M, a, b, and n may be as previously defined for Formulas (II)-(IV). The values of d and b may be the same or approximately the same for each repeat unit so that the copolymer has a regular structure. Where Z is an optionally substituted hydrocarbon or heteroaryl, it may be as previously defined for R.

When e is 0, the Formula (V) is represented by Formula (VI):

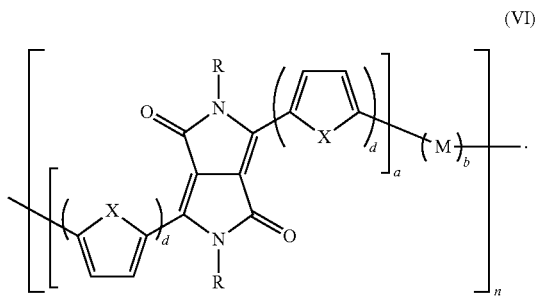

(VI)

In Formulas (V) and (VI), each Ar group represented by

includes at least one heterocycle, such as thiophene, furan, or pyrrole.

When b is 0, Formula (V) is represented by Formula (VII):

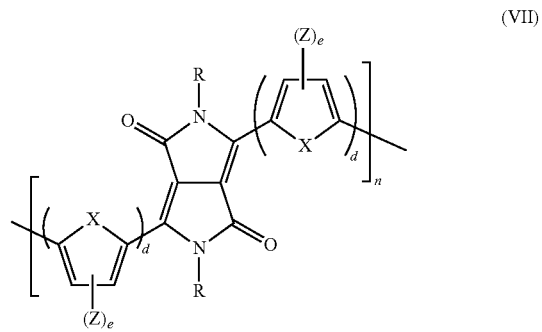

(VII)

where X, R, Z, d, e, and n are as defined for Formula (V).

When e is 0, Formula (VII) is represented by Formula (VIII):

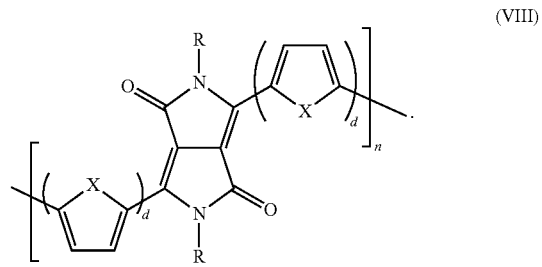

(VIII)

Exemplary compounds according to Formula (VIII) include one or more of a (2,5-dialkyl-3,6-bis(thienyl/furyl/pyrrolyl-5-yl)-diketopyrrolopyrrole), a poly(2,5-dialkyl-3,6-bis(thienyl/furyl/pyrrolyl-5-yl)-diketopyrrolopyrrole), a (2,5-diaryl-3,6-bis(thienyl/furyl/pyrrolyl-5-yl)-diketopyrrolopyrrole), a poly(2,5-diaryl-3,6-bis(thienyl/furyl/pyrrolyl-5-yl)-diketopyrrolopyrrole), a (3,6-bis(thienyl/furyl/pyrrolyl-5-yl)-diketopyrrolopyrrole), a poly(3,6-bis(thienyl/furyl/pyrrolyl-5-yl)-diketopyrrolopyrrole), and combinations thereof.

Exemplary semiconducting compounds of Formulas (I)-(VIII) include:

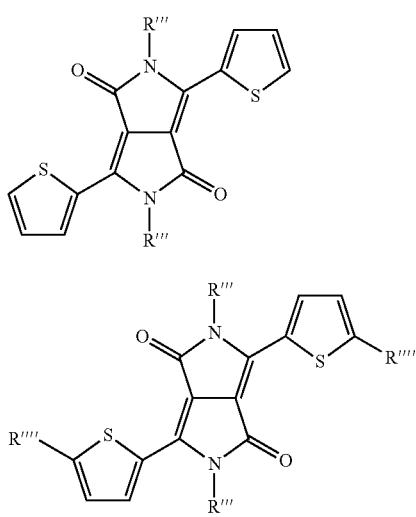

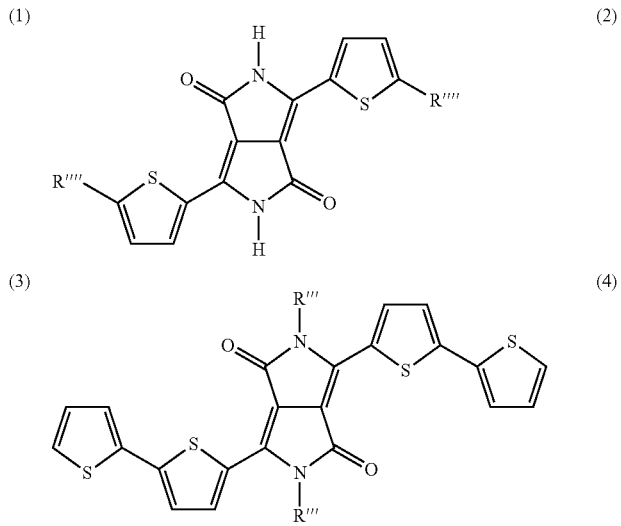

-continued
(5)
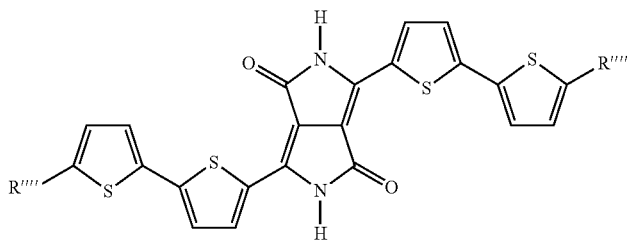
(6)
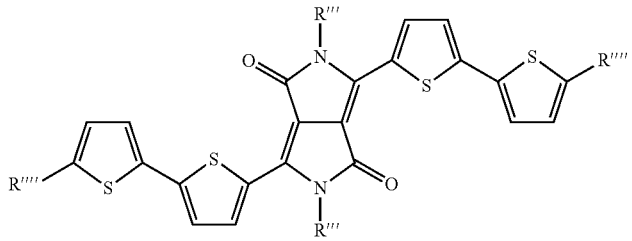
(7)
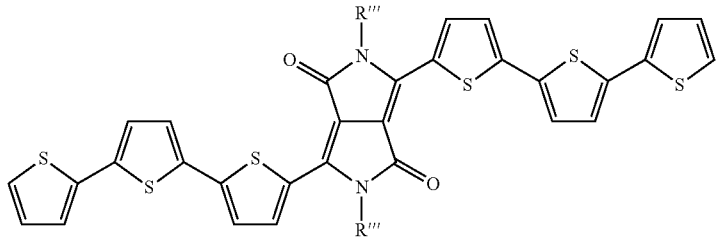
(8)
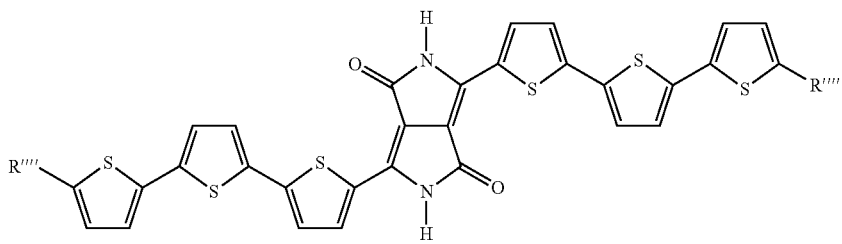
(9)
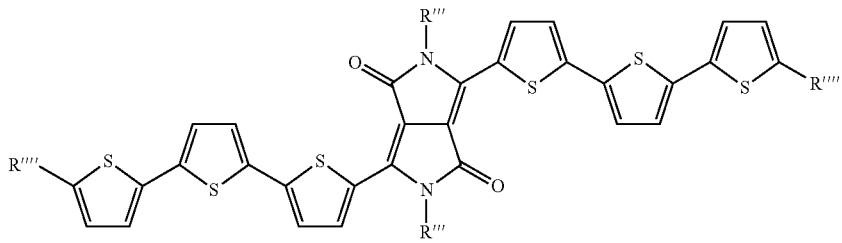
(10)
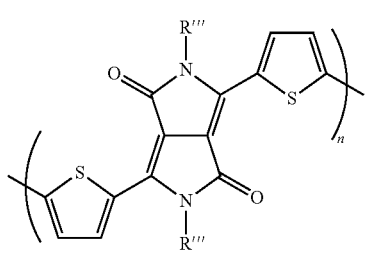
(11)
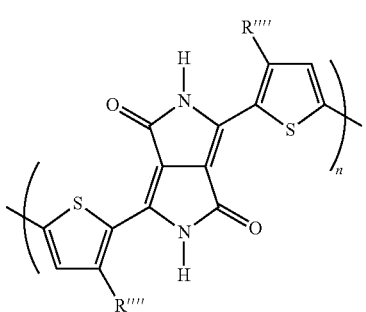

-continued
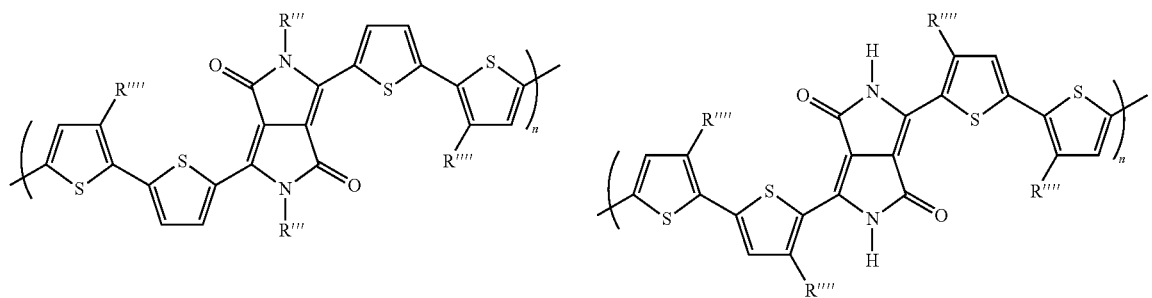
(12)
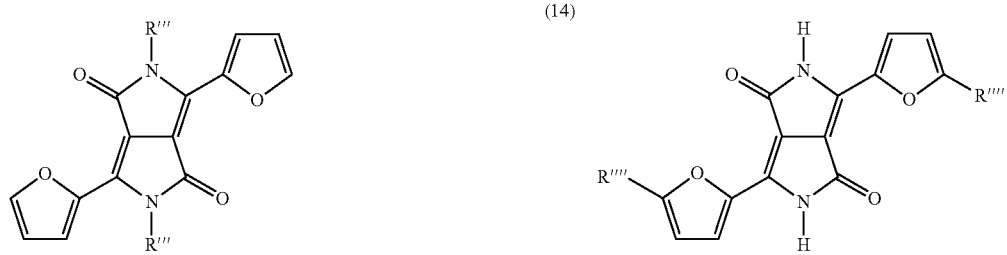
(13)
(14)
(15)
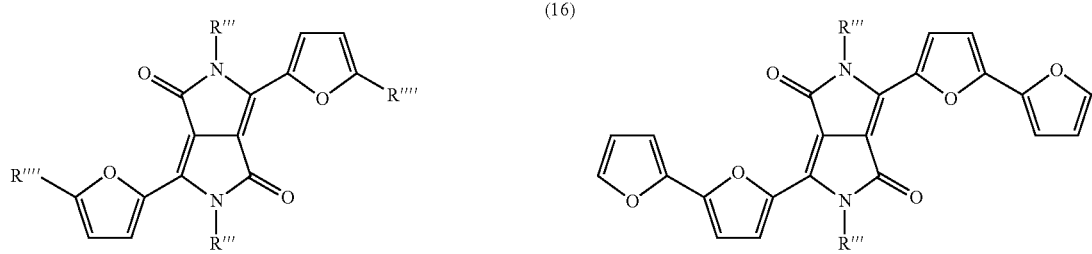
(16)
(17)
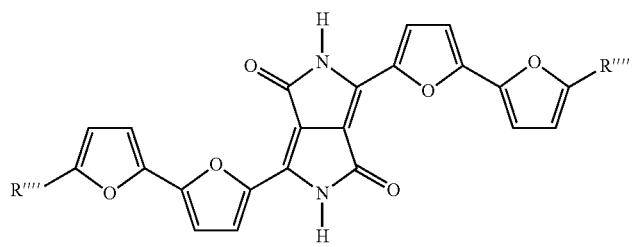
(18)
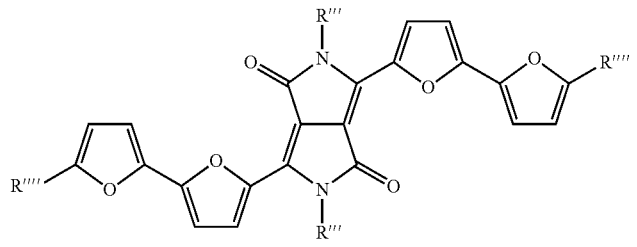
(19)
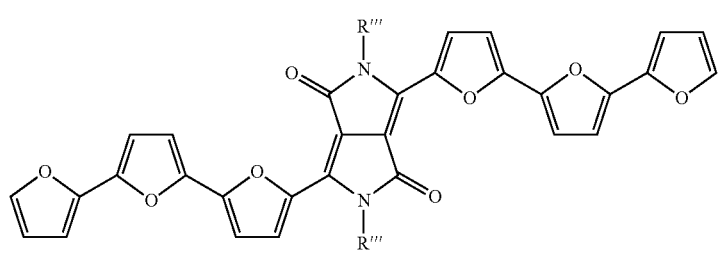
(20)

-continued
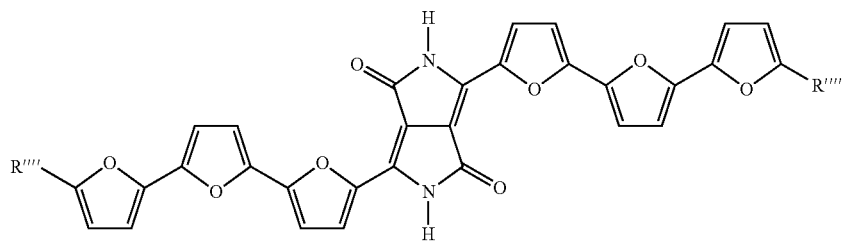
(21)
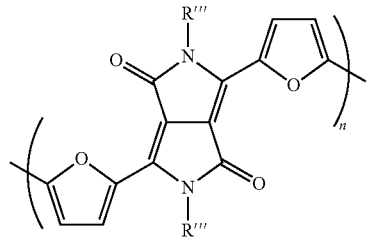
(22)
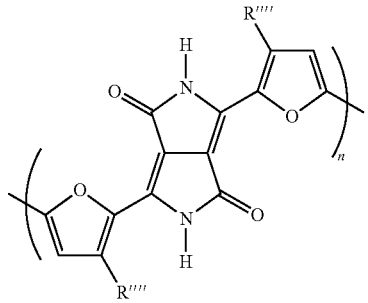
(23)
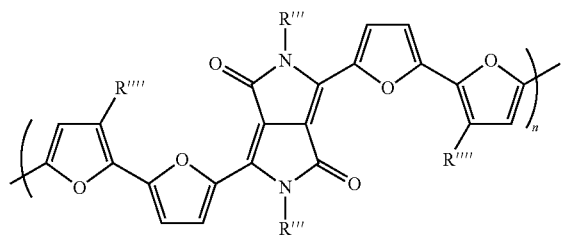
(24)
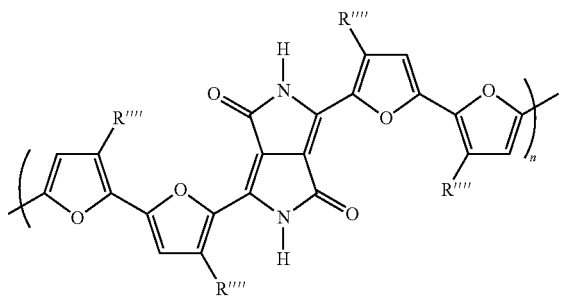
(25)
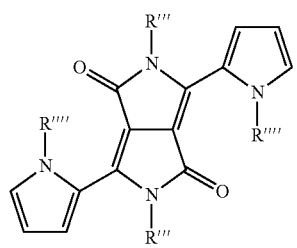
(26)
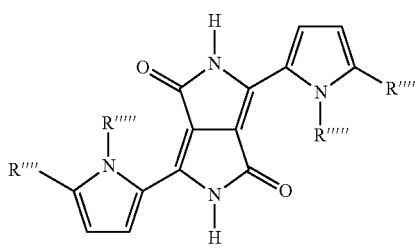
(27)
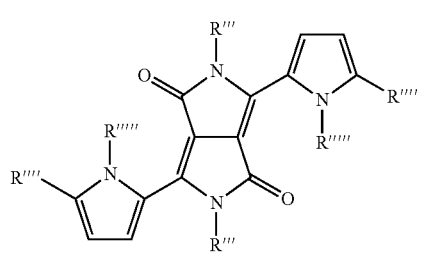
(28)
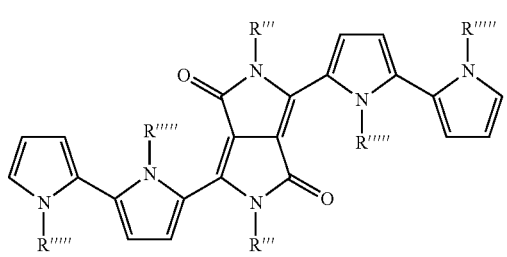
(29)
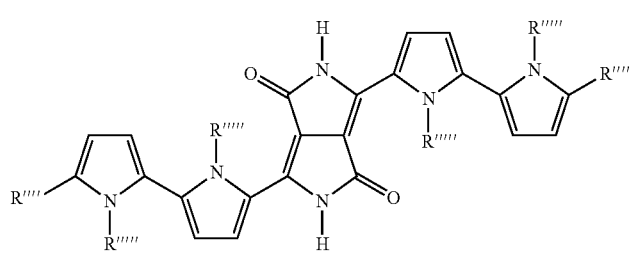
(30)

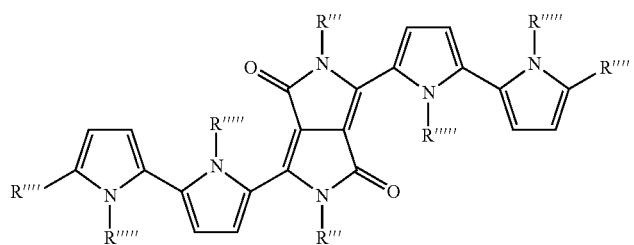
(31)
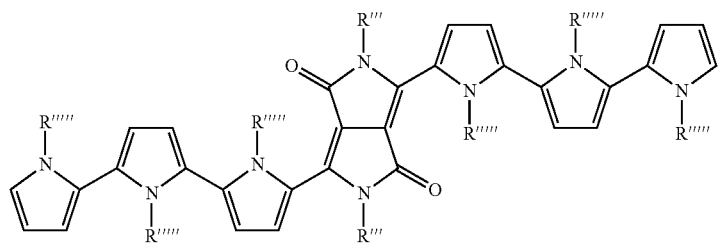
(32)
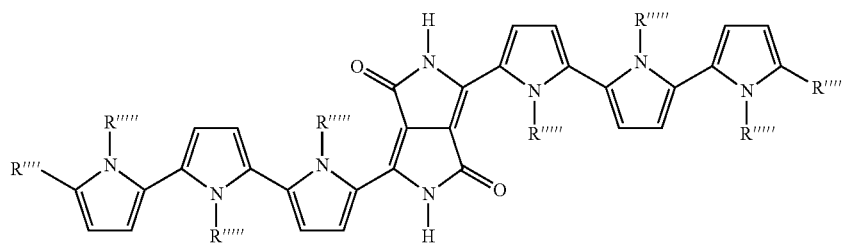
(33)
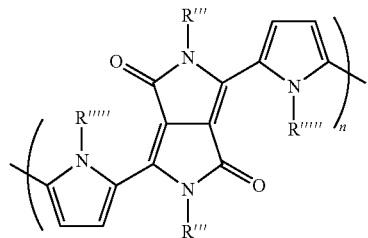
(34)
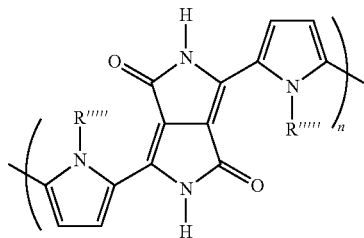
(35)
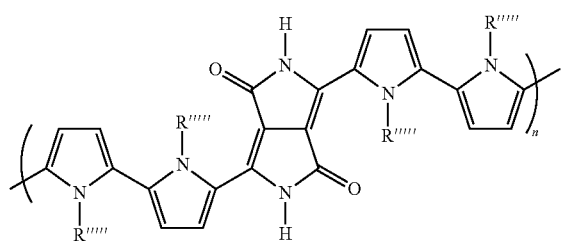
(36)
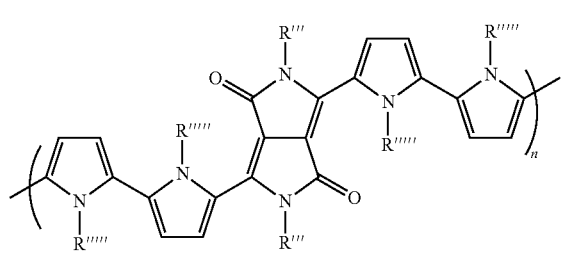
(37)

-continued
(38)
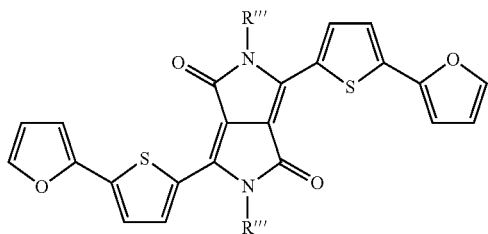
(39)
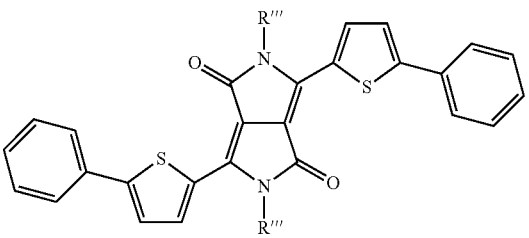
(40)
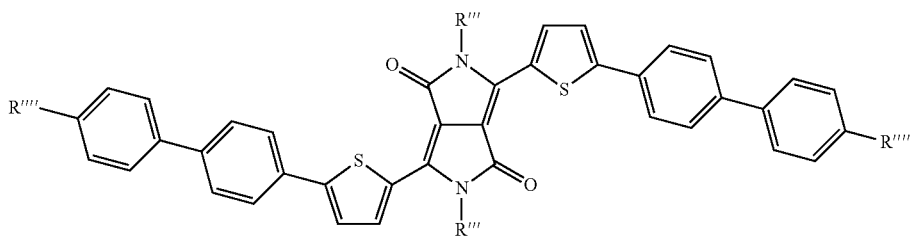
(41)
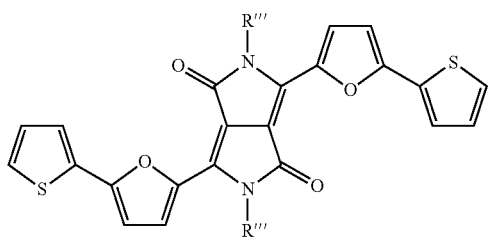
(42)
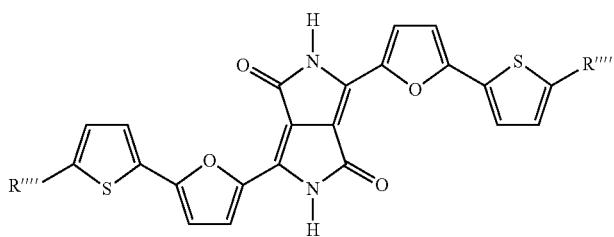
(43)
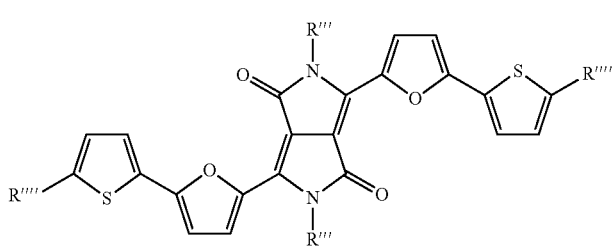
(44)
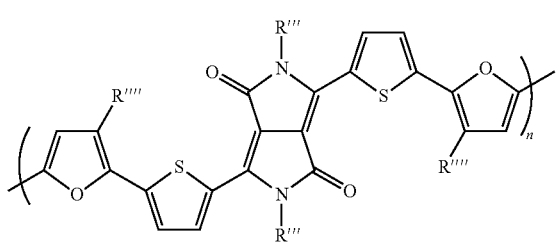
(45)
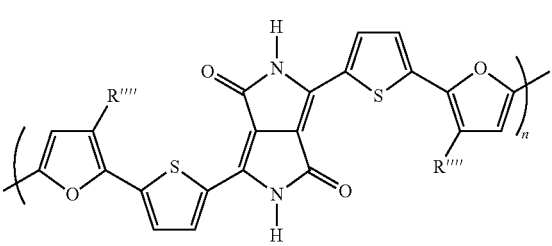

-continued
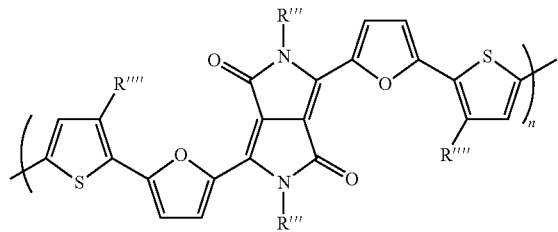
(46)
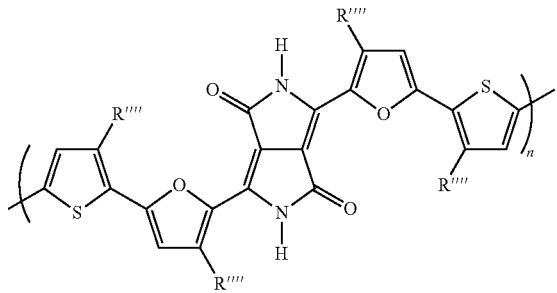
(47)
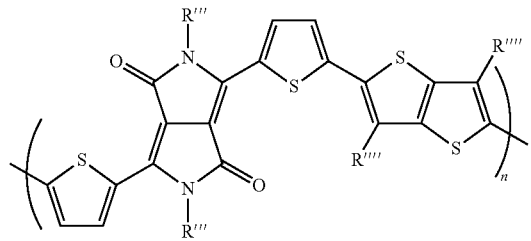
(48)
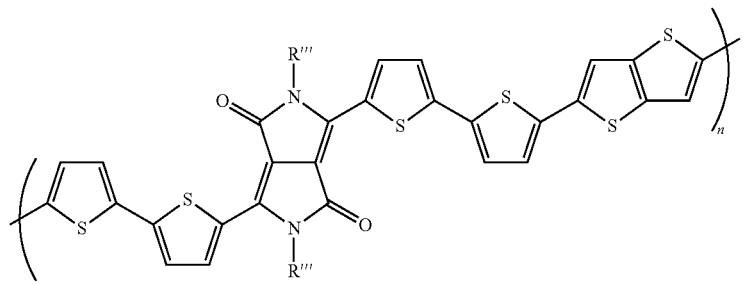
(49)
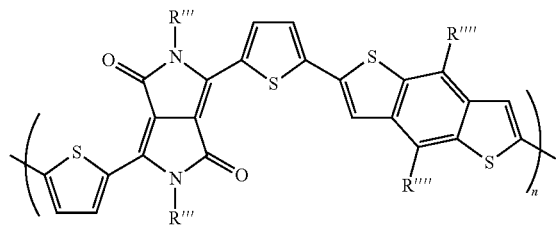
(50)
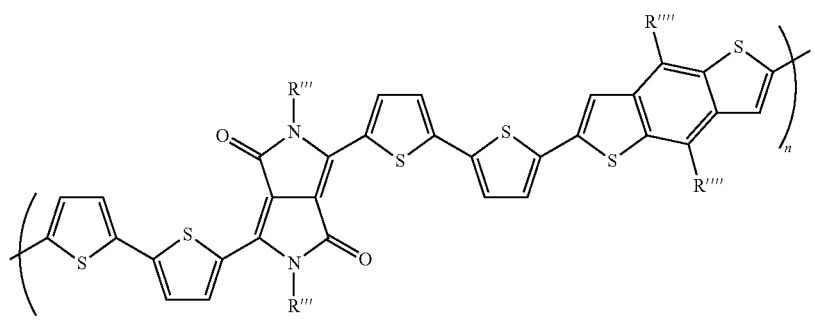
(51)
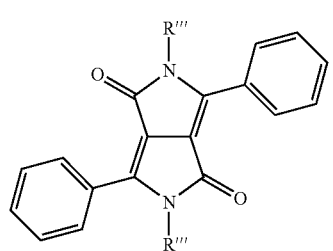
(52)
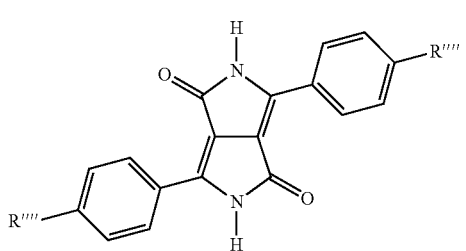
(53)

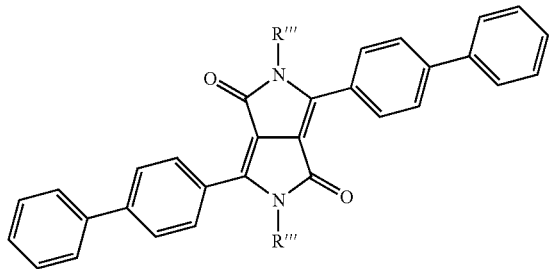
(54)
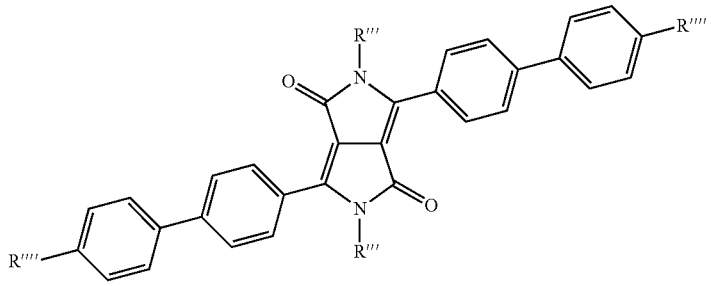
(55)
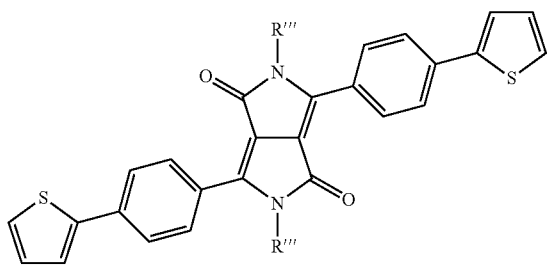
(56)
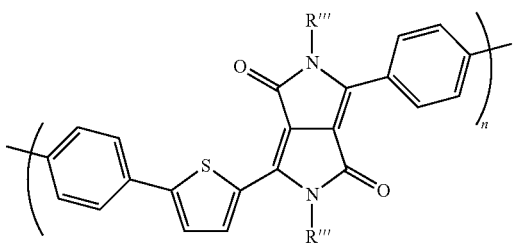
(57)
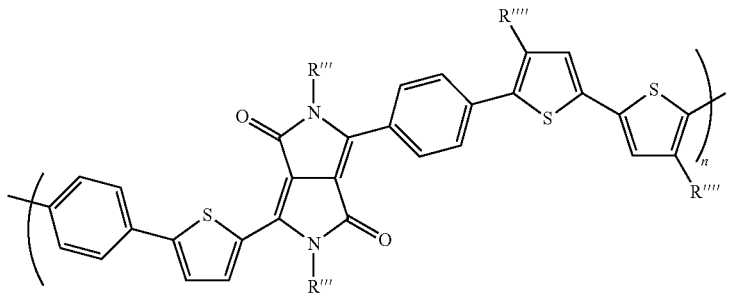
(58)
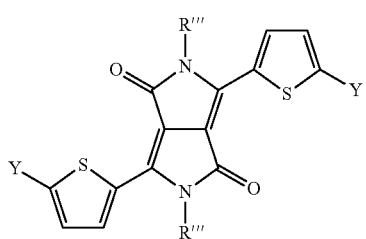
(59)
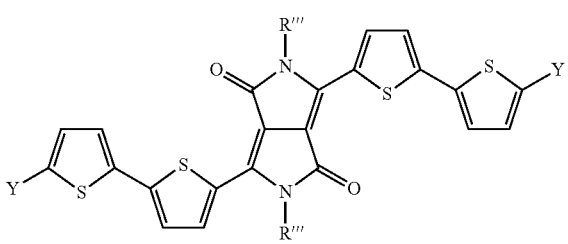
(60)

-continued

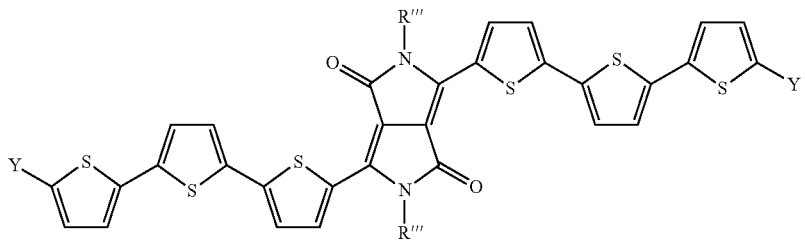

(61)

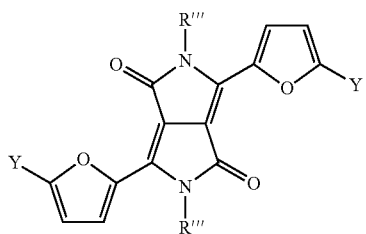

(62)

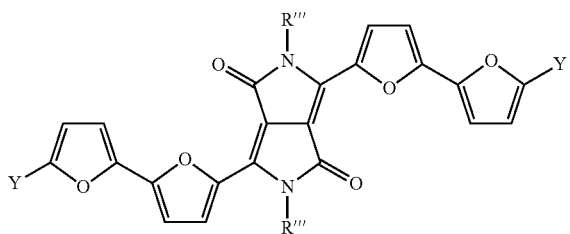

(63)

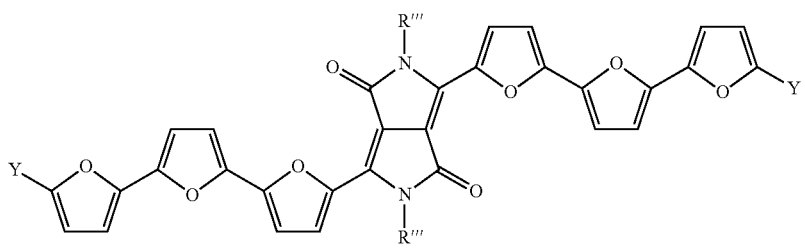

(64)

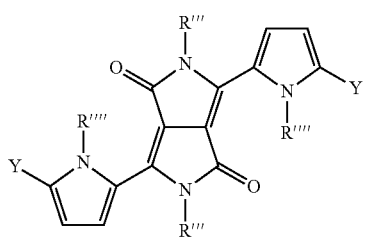

(65)

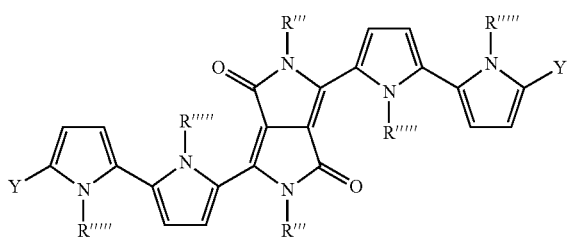

(66)

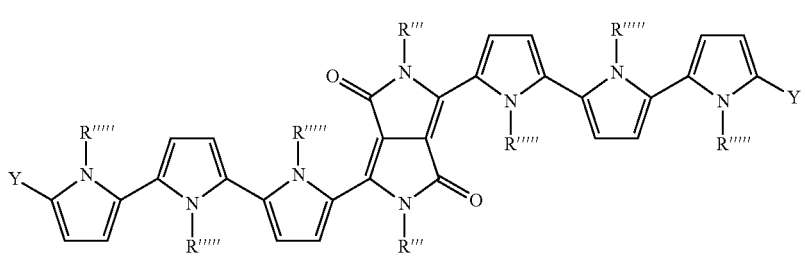

(67)

and mixtures thereof, wherein n is an integer representing the number of repeat units and may be from about 2 to about 5000, such as from about 2 to about 1000, or from about 50 to about 2000; R''', R'''', and R''''' may be the same or different substituent independently selected from the group consisting of an optionally substituted hydrocarbon group and a heteroatom-containing group; and Y is a halogen atom selected from F, Cl, and Br.

While not being bound by any particular theory, the electron-withdrawing nature of the diketone and the high coplanarity of this structure give these polymers high field-effect mobility and excellent air-stability when the polymers are used as p-channel semiconductors in OTFTs. The five-membered heterocycles, such as thiophene, furan, and pyrrole, in the polymers are electron-rich and thus facilitate hole injection and transport in the TFT devices. In addition, the less steric effect of the five-membered heterocycles minimizes the twisting of the polymer backbone, leading to high coplanarity of the backbone, a feature for achieving high mobility.

The polymers of Formulas (V)-(VIII) may be prepared by the following four step process.

First, a DKPP moiety may be formed by reacting a nitrile or Schiff base with a succinic acid diester in the presence of a base and an organic solvent. For example, a carbonitrile (Ar—CN) for forming the selected Ar group (e.g., thiophenecarbonitrile) may be reacted with a succinate (e.g. diisopropyl succinate or di-n-butyl succinate) under suitable conditions for ring closure of the DKPP moiety to form a monomer M1 of the following formula:

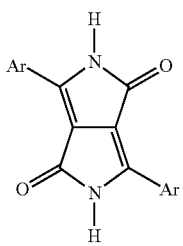

M1 where Ar is as defined above.

For example, formation of the DKPP moiety may be carried out in solution in the presence of a sodium alkoxide, such as $t-C_5H_{11}ONa$, which may be formed in situ, followed by neutralization with an organic acid, such as glacial acetic acid. The reaction may be performed at a suitable reaction temperature, such as about 85° C.

H groups on the nitrogen atoms of the monomer (M1) may optionally be converted from H to a selected R group by reaction of the monomer with a halide of the formula R—Y, where R is as defined above (other than H) and Y is a halogen, such as chlorine, bromine, and iodine. A monomer of the following structure (M2) may thus be formed:

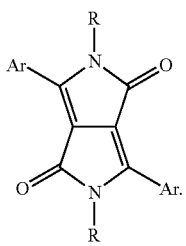

M2

When R is aryl, substituted aryl, heteroaryl, or substituted heteroaryl, a palladium or copper catalyst may be required.

Conversion of the H groups to R groups may be performed in solution at a suitable reaction temperature, such as from about 40° C. to about 180° C., from about 40° C. to about 120° C. The reaction may be carried out in a suitable solvent, such as dimethylformamide, in the presences of an aqueous base, such as an alkali metal hydroxide or carbonate and a crown ether, such as 18-crown-6. Suitable aqueous bases include NaH, NaOH, KOH, t-BuOna, t-BuOK, $Na_2CO_3$, $K_2CO_3$, and the like. The molar ratio of the base to compound M1 may be in the range of from about 0.5:1 to about 50:1.

The Ar groups may be halogenated, for example, by reaction of the monomer (M1) or (M2) with a halogen, such as bromine, chlorine, or iodine, to form monomer (M3):

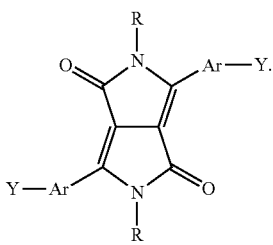

(M3)

where Y can be a halogen, such as bromine, chlorine, or iodine. The halogenation may be carried out in any suitable non-reactive medium, such as chloroform at a temperature of room temperature or above, such as from about −5° C. to about 100° C.

The monomer may then be thiolated, for example by using Lawesson's reagent, to convert the carbonyl groups into thiocarbonyl groups to form a dithioketopyrrolopyrrole (DTKPP) moiety.

Monomer M3 may be copolymerized with a comonomer for forming units M of Formulas (IV)-(VI). Suitable comonomers for providing the M unit include thiophene, furan, pyrrole, thieno[3,2-b]thiophene, benzo[1,2-b:4,5-b']dithiophene, and combinations thereof.

The copolymerization may be performed in solution in the presence of a ditin compound, such as a hexaalkylditin or hexaarylditin compound, such as hexamethylditin, hexa-n-butylditin, or hexaphenylditin, and a catalyst suitable for coupling reactions or for polycondensation reactions, optionally in the presence of copper(I) iodide. A suitable coupling catalyst is a palladium-based catalyst, for example, a tetrakis(triarylphosphonium)-palladium catalyst, such as tetrakis(triphenylphosphine)palladium(0) ($Pd(PPh_3)_4$), $Pd(PPh_3)_2Cl_2$, $PdOAc_2$, $Pd(dba)_3$:$P(o-Tol)_3$, or derivatives thereof. The catalyst may be added in a molar ratio of DKPP monomer to the catalyst in the range of from about 1000:1 to about 10:1, such as from about 100:1 to about 30:1. A suitable solvent for the reaction may be a mixture of THF and 1-methyl-2-pyrrolidinone (NMP). The reaction may be carried out under reflux at a temperature that is at or slightly above the boiling point of the solvent.

The resulting polymer may then be purified, for example, by Soxhlet extraction.

The polymers/copolymers formed may have a weight average molecular weight $M_w$ from about 700 to about 2,000,000, such as from about 1,000 to about 800,000, or from about 2,000 to about 500,000.

Exemplary polymers include diketopyrrolopyrrole quarterthiophene (DKPP-QT, Polymer 1 below) and diketopyrrolopyrrole thienothiophene (DKPP-TT, Polymer 2 below).

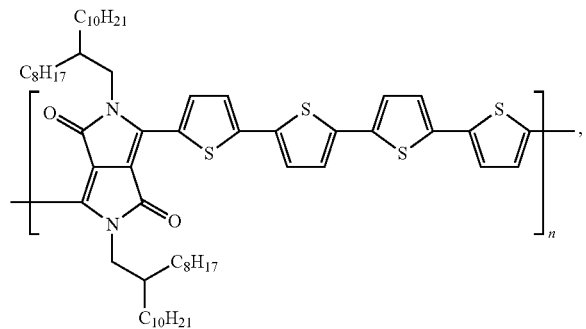

Polymer 1

DKPP-QT

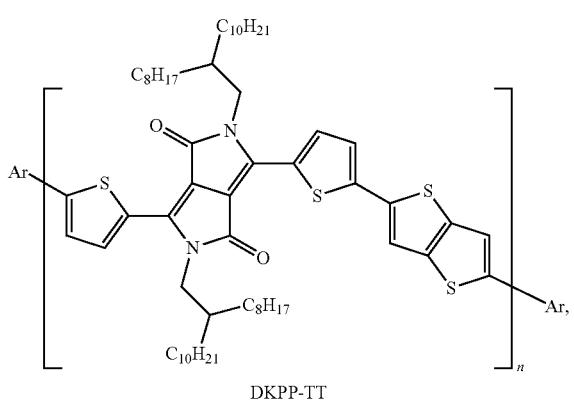

Polymer 2

DKPP-TT

A layer comprising the polymer may be incorporated into a semiconductor device.

Carbon Nanotubes

The semiconductor composition also comprises carbon nanotubes (CNTs). CNTs may be present in an amount of from about 0.01 to about 15 wt % based on the total weight of the semiconductor composition, such as about 0.1 to about 5 wt %, or about 2 to about 3 wt %.

CNTs are allotropes of carbon. They take the form of cylindrical carbon molecules and have properties that make them useful in a wide variety of applications in nanotechnology, electronics, optics, and other fields of materials science. CNTs exhibit extraordinary strength, unique electrical properties, and efficient heat conductor properties. The diameter of a CNT may be small, such as less than 2.5 nm, for example less than 2.0 nm, or less than 10.nm. The CNT may be a straight carbon nanotube. For example, the curvature of the CNT in its naturally dispersed state (i.e., without external force for bending or stretching) may be less than 0.2 micron, such as less than 0.1 micron, or less than 0.005 micron.

The CNTs may be single-wall carbon nanotubes (SWCNTs), double-wall carbon nanotubes, or multi-wall carbon nanotubes. A SWCNT is a cylinder formed by joining together the edges of a rectangular graphene sheet. A multi-wall carbon nanotube is composed of a number of cylindrical carbon nanotubes having different diameters, which are formed concentrically around each other. The CNTs may have any suitable length, diameter, and curvature.

SWCNTs may have a diameter of from about 0.5 to about 2.5 nm, such as from about 0.7 to about 2.5 nm, from about 0.7 to 1.2 nm, or from about 0.7 to about 1.0 nm. SWCNTs may have a length of from about 0.1 to about 30 μm, such as from about 0.5 to about 10 μm, from about 0.5 to about 5 μm, or from about 0.7 to about 2.5 μm. The aspect ratio of the SWCNTs may be from about 500 to about 10,000, such as from about 500 to about 5,000, or from about 500 to about 1500. The SWCNTs may have differing diameters, lengths, or aspect ratios within the listed distribution ranges.

The CNTs may be surface-modified. The surface modifying group may be attached on the wall or at the ends of the CNTs. The surfaces of the CNTs may be modified by non-covalent attachment and/or covalent attachment.

The surface-modified carbon nanotubes may be represented by the following formula:

CNT-$R_1$—$R_2$ wherein CNT represents the carbon nanotube, $R_1$ is a linking group selected from ester (—COO—) and amide (—CONH—); and $R_2$ is selected from a conjugated group, a non-conjugated group, a small molecular group, an inorganic material, and combinations thereof. The degree of surface modification may vary from about 1 group per CNT to about 1000 groups per CNT, such as from about 2 to about 500 groups, or from about 2 to about 100 groups.

Exemplary conjugated groups include thiophene-based oligomers, pyrenyl, fluorenyl, carbazolyl, triarylamine, and phenyl. The conjugated group may be covalently bonded directly to the surface of the CNTs or through a linking group, such as amide or ester.

Exemplary non-conjugated groups include alkyl, alkoxy, cyano, nitro, urethane, styrene, acrylate, amide, imide, ester, and siloxanes. Also included are non-conjugated groups comprising an acidic moiety, selected from the group consisting of carboxylic acid, sulfonic acid, phosphinic acid, sulfuric acid, nitric acid, phosphoric acid, and the like. The surface-modified carbon nanotubes may be modified with carboxylic acid, sulfuric acid, or nitric acid. The carbon nanotube-supported acid may dope a semiconductor, particularly p-type semiconductor, to enhance conductivity of the semiconductor layer and, thus, the field-effect mobility of the transistors.

The inorganic material may be conducting or semiconducting. Suitable inorganic materials include metals and metal oxides such as gold, silver, copper, nickel, zinc, cadmium, palladium, platinum, chromium, aluminum, ZnO, ZnSe, CdSe, $Zn_aIn_bO_c$ (where a, b, and c are integers), GaAs, $ZnO.SnO_2$, $SnO_2$, gallium, germanium, tin, indium, indium oxide, indium tin oxide, and the like. The inorganic material may homogenously cover the surface of the CNTs or be in nanoparticle form on the surface of the CNTs. The surface-modified carbon nanotubes may be modified with nanoparticles selected from the group consisting of gold, silver, nickel, copper, ZnO, CdSe, $Zn_aIn_bO_c$, GaAs, $ZnO.SnO_2$, $SnO_2$, and ZnSe nanoparticles.

Modifying the surface of the CNTs may enable better miscibility between the CNTs and the semiconducting polymer, such as the copolymer of DKPP-QT of Polymer 1 or the copolymer of DKPP-TT of Polymer 2. The surface modification increases solubility and allows real nano-scale dispersion of the CNTs in the polythiophene. When the surface is modified with a conjugated moiety, better charge transfer occurs between the CNTs and the polythiophene semiconductor.

CNTs may be surface modified by suitable methods. For example, a reactive site may be created on the CNTs, and then an oligomer or small molecular compound may be grafted onto the CNTs at that reactive site. Another suitable method introduces carboxylic acid groups onto a CNT surface via an acid treatment. For example, a mixture of sulfuric acid and nitric acid may be used to form carboxylic acid groups on the surface of a CNT. Other surface modifying groups may then react with the carboxylic acid group. Other suitable methods include plasma treatment or direct reaction with highly reactive chemicals such as dichlorocarbene.

In some embodiments, the CNTs are not surface modified. When dispersed with the semiconducting polymer, the semiconducting polymer may stabilize the CNTs in the liquid, for example, by wrapping on the surface of the CNTs, by forming aggregates together with the CNTs, or by any other possible mechanism. Being capable of forming polymer aggregates helps disperse and stabilize the CNTs in the semiconductor composition. The dispersed CNTs may function as nuclei so that polymer aggregates may form around the individual CNTs. As a result, the polymer aggregates help disperse and stabilize the CNTs in the liquid.

Suitable CNTs may be produced by various processes, such as by a laser ablation process, a chemical vapor deposition process, or an arc discharge process.

A laser ablation process for producing a carbon nanotube includes a pulsed laser vaporizing a graphite target in a high-temperature reactor while an inert gas is bled into the chamber. This process often provides high nanotube yield, such as about 70%, and primarily single-walled CNTs with a controllable diameter determined by the reaction temperature.

A chemical vapor deposition process for producing a carbon nanotube may include metal catalyst particles, commonly nickel, cobalt, or iron.

An arc discharge process for producing a carbon nanotube may include negative carbon-containing electrode sublimation during an arc discharge. This process often provides a low CNT yield, such as about 30%, and a mixture of both single and multi-walled CNTs.

The CNTs produced using the above processes may be purified to a high purity by various methods. For example, the purified CNTs may have a carbon content of at least about 90 wt %, at least about 95 wt %, or at least about 98 wt %.

CNTs produced using different processes may exhibit difference properties. For example, depending on the process used, the diameter and the morphology of the CNTs may be different.

Semiconductor Compositions

A semiconductor composition comprising a semiconducting polymer as disclosed herein may be produced by dispersing CNTs in a solvent in which the polymer is soluble to form a CNT dispersion and adding a semiconducting polymer to and dissolving the semiconducting polymer in the CNT dispersion, forming a dispersion of CNTs and the semiconducting polymer. Suitable solvents include chlorinated solvents, such as chlorobenzene, chlorotoluene, dichlorobenzene, 1,2-dicholorbenzene, dichloroethane, and the like; alcohols and diols, such as propanol, butanol, hexanol, hexanediol, and the like; hydrocarbons or aromatic hydrocarbons, such as hexane, heptane, toluene, xylene, mesitylene, trimethyl benzene, ethyl benzene, tetrahydronaphthalene, decalin, methyl naphthalene, and the like; ketones, such as acetone, methyl ethyl ketone, and the like; and acetates, such as ethyl acetate; pyridine, tetrahydrofuran, and the like.

After the CNT is added to the solvent, the CNT mixture may be probe ultra-sonicated at about at least 50% power, such as about 60%, or about 80%, for about 20 s, such as from about 5 s to about 100 s, or from about 10 s to about 30 s, to form the CNT dispersion. A polymer containing a diketopyrrolopyrrole (DKPP) moiety may be added to the CNT dispersion. The polymer may be added to a concentration of, for example, about 0.6 wt % based on the total mixture, such as from about 0.01 to about 5 wt %, from about 0.1 to about 5 wt %, or from about 0.1 to about 3 wt %. The weight ratio of the polymer and CNT may vary from about 99.9:0.1 to about 85:15, such as from about 99:1 to about 90:10, or from about 99:1 to about 95:5. The copolymer may then be dissolved by, for example, heating the mixture. The mixture containing the dissolved polymer may be probe ultra-sonicated for about 20 s, such as from about 5 s to about 100 s, or from about 10 s to about 30 s. The resulting dispersion of CNT in the polymer may be stable for a time period of at least about 1 day, such as about 1 week, or about 1 month.

CNT agglomerates may optionally be removed from the dispersion. For example, CNT agglomerates having a size larger than about 500 nm, such as larger than about 1.0 micron, or larger than about 2.0 micron, may be removed from the dispersion by any known removal technique, such as centrifugation.

In the semiconductor composition and the resulting semiconducting layer, the weight ratio of the CNTs to the semiconducting polymer may be from about 0.1:99.1 to about 50:50, for example from about 0.1:99.9 to about 15:85, or from about 1:99 to about 3:97. The semiconducting polymer may be less than about 5.0 wt % of the semiconductor composition, such as less than about 2.0 wt %, less than about 1.0 wt %, or from about 0.1 to about 0.8 wt %.

The presence of CNTs in the semiconducting layer can improve the mobility of the TFT. The CNTs are generally more conductive than the semiconducting polymer. The CNTs can form non-percolating arrays inside a channel of a semiconductor device. The effective channel length can thus be reduced, dramatically improving the mobility of the semiconductor device. The CNTs can electrically connect adjacent crystal domains of the semiconductor, overcoming the grain boundary effect, which typically decreases mobility. The CNTs can also enable the formation of Ohmic contact at the electrode/semiconductor interface, thus reducing the contact resistance. The mobility can be improved by at least 50%, such as at least 100%, or at least 2 times, over the mobility of a TFT device having the semiconducting polymer without CNTs.

Semiconductor Devices

A semiconducting layer comprising the polymer and CNTs may be incorporated into an electronic device, such as, for example, a TFT, a sensor, or photovoltaic devices.

The semiconducting layer may be formed in an electronic device using conventional processes, such as by using solution depositing techniques including spin coating, blade coating, rod coating, dip coating, screen printing, ink jet printing, stamping, stencil printing, screen printing, gravure printing, flexography printing, and the like.

For example, the semiconductor devices may be fabricated by spin coating the polymer-stabilized CNT solution onto a modified wafer substrate at a rate of about 1000 to about 2500 revolutions per minute (rpm), forming a semiconducting layer on the wafer.

The semiconducting layer formed using the semiconductor composition may have a thickness of from about 5 to about 1000 nm, such as from about 20 to about 100 nm, or from about 10 to about 50 nm. The semiconducting layer may completely cover the source and drain electrodes.

The performance of a semiconductor device may be measured by mobility. The mobility is measured in units of $cm^2/V \cdot s$, and higher mobility is desired. The resulting semiconductor device containing the semiconductor composition may have an average field effect mobility of at least about 1.0 $cm^2/V \cdot s$, such as at least about 1.2 $cm^2/V \cdot s$, or at least about 1.5 $cm^2/V \cdot s$. The semiconductor device may have a current on/off ratio of at least about $10^5$, such as at least about $10^6$, or at least about $10^7$.

A TFT generally includes a substrate, an optional gate electrode, source electrode, drain electrode, and a dielectric layer in addition to the semiconducting layer.

Organic thin-film transistor (OTFT) devices contain a semiconductor channel. The semiconductor channel width may be, for example, from about 5 μm to about 5 mm, such as from about 50 μm to about 1 mm, or from about 100 to about 500 microns. The semiconductor channel length may be, for example, from about 1 μm to about 1 mm, such as from about 5 μm to about 100 μm, or from about 5 to about 50 microns.

The substrate may be composed of materials including silicon, glass plate, plastic film, or sheet. For structurally flexible devices, plastic substrate, such as polyester, polycarbonate, polyimide sheets, and the like may be used. The thickness of the substrate may be from about 10 μm to over 10 mm, such as from about 50 to about 100 μm, or from about 0.5 to about 10 mm.

The dielectric layer may be an inorganic material film, an organic polymer film, or an organic-inorganic composite film. Suitable inorganic materials include silicon oxide, silicon nitride, aluminum oxide, barium titanate, barium zirconium titanate, and the like. Examples of suitable organic polymers include polyesters, polycarbonates, poly(vinyl phenol), polyimides, polystyrene, polymethacrylates, polyacrylates, epoxy resin, and the like. The thickness of the dielectric layer depends on the dielectric constant of the material used and may be, for example, from about 10 to about 2000 nm, such as from about 50 to about 1000 nm, or from about 100 to about 600 nm. The dielectric layer may have a conductivity that is, for example, less than about $10^{-12}$ Siemens per centimeter (S/cm). The dielectric layer may be Banned using conventional processes known in the art, including those processes described below in forming the gate electrode.

The dielectric layer may be surface modified. Suitable surface modifiers include small molecular silane agents such as hexamethyldisilazane (HMDS) and octyltrichlorosilane (OTS-8), or polymeric modifiers such as a polysilsesquioxane, a polysiloxane, or a fluoropolymer. The semiconducting layer may be directly contacted with this modified dielectric layer surface. The contact may be complete or partial. This surface modification may also be considered as forming an interfacial layer between the dielectric layer and the semiconducting layer.

The gate electrode is composed of an electrically conductive material, such as a thin metal film, a conducting polymer film, a conducting film made from conducting ink or paste, or the substrate itself, for example heavily doped silicon. Examples of gate electrode materials include aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite. The gate electrode may be prepared by vacuum evaporation, sputtering of metals or conductive metal oxides, conventional lithography and etching, chemical vapor deposition, spin coating, casting or printing, or other deposition processes. The thickness of the gate electrode may range from about 10 to about 200 nm, such as from about 1 to about 10 μm.

Suitable materials for the source and drain electrodes include those of the gate electrode materials such as aluminum, gold, silver, nickel, platinum, chromium, zinc, indium, conductive metal oxides such as zinc-gallium oxide, indium tin oxide, indium-antimony oxide, conducting polymers, and conducting inks. The electrode materials may provide low contact resistance to the semiconductor. The thicknesses of the source and drain electrodes may be, for example, from about 40 am to about 1 μm, such as from about 100 to about 400 nm.

The source electrode is grounded and a bias voltage of, for example, about 0V to about 80V, such as about 2V to about 60V, or about 2V to about 20V, is applied to the drain electrode to collect the charge carriers transported across the semiconductor channel when a voltage of, for example, about +10V to about −80 V is applied to the gate electrode. The electrodes may be formed or deposited using conventional processes.

If desired, a barrier layer may also be deposited on top of the TFT to protect it from environmental conditions, such as light, oxygen, and moisture, which may degrade its electrical properties. Such barrier layers may simply consist of polymers.

The various components of the TFT may be deposited on the substrate in any order. Generally, however, the gate electrode and the semiconducting layer may both be in contact with the gate dielectric layer. In addition, the source and drain electrodes may both be in contact with the semiconducting layer. The phrase "in any order" includes sequential and simultaneous formation. For example, the source electrode and the drain electrode may be formed simultaneously or sequentially. The term "on" or "upon" the substrate refers to the various layers and components with reference to the substrate as being the bottom or support for the layers and components which are on top of it. In other words, all of the components are on the substrate, even though they do not all directly contact the substrate. For example, both the dielectric layer and the semiconducting layer are on the substrate, even though one layer is closer to the substrate than the other layer. The resulting TFT has good mobility and good current on/off ratio.

EXAMPLES

The following Examples are being submitted to illustrate embodiments of the present disclosure. These Examples are intended to be illustrative only and are not intended to limit the scope of the present disclosure. Also, parts and percentages are by weight unless otherwise indicated. As used herein, "room temperature" refers to a temperature of from about 20° C. to about 30° C.

Comparative Example

TFTs were fabricated on a silicon wafer substrate. N-doped silicon functions as the gate and the gate dielectric is 200-nm silicon oxide. The oxide was modified with octyltrichlorosilane by immersing the silicon wafer in 0.1 toluene solution for 20 min at 60° C. 12 mg of Polymer (1), DKPP-QT, was dissolved in 2 g of 1,1,2,2-tetrachloroethane solvent with the assistance of heat and shaking to form a dark blue solution. The solution was then filtered with a 0.2 μm syringe filter, and spin coated at 2000 rpm onto an octyltrichlorosilane modified silicon wafer substrate, forming a very smooth and shiny semiconductor film. After the semiconductor film was dried and annealed in a vacuum oven at 150° C. for 10 min, the gold source/drain electrodes were vapor evaporated on top of the semiconductor layer to form a series of transistors. At least 20 transistors were evaluated using Keithley SCS4200 at ambient conditions (about 25° C., about 50% humidity, and normal light). The device exhibited a high current on/off ratio of greater than $10^6$ and an average mobility of 0.58 cm$^2$/V·s.

Example 1

A single wall carbon nanotube (SWCNT) (Bucky, USA) was added into 1,2-dichlorobenzene. The semiconductor had a curvature less than 0.1 micron. The mixture was probe ultra-sonicated at 50% power for 20 s. Polymer 1, DKPP-QT, was added to the CNT dispersion to a concentration of 0.6 wt %. The weight ratio between the DKPP-QT and CNT varied from 99:1 to 85:15. The mixture was heated to 60° C. to dissolve the DKPP-QT, followed by probe ultra-sonication for 20 s, resulting in a stable dispersion of CNT in DKPP-QT solution for about 3 weeks. The dispersion was further centrifuged at 3600 rpm to remove any CNT agglomerates larger than about 1 micron before fabricating the TFT device.

The TFT devices were fabricated in a manner similar to that of the Comparative Example. DKPP-QT-stabilized CNT solution was spin coated on the modified wafer substrate at 1000 to 2500 rpm to form the semiconducting CNT layer. The resulting device exhibited a high current on/off ratio of greater than $10^6$, an average mobility of 0.85 cm²/V·s at 1 wt % CNT content, and an average mobility of 1.17 cm²/V·s at 15 wt % CNT content. Thus, the mobility was improved by a factor of 2 at 15 wt % CNT loading.

Example 2

A single wall carbon nanotube (SWCNT) (Aldrich) was added into a 1,1,2,2-tetrachloroethane. The carbon nanotube had an average diameter of less than 2.0 nm, and a curvature of less than 0.05 micron. The mixture was probe ultra-sonicated at 50% power for 20 s. Polymer 1, DKPP-QT, was added to the CNT dispersion to a concentration of 0.6 wt %. The weight ratio between the DKPP-QT and CNT varied from 99.9:0.1 to 95:5. The mixture was heated to 60° C. to dissolve the DKPP-QT, followed by probe ultra-sonication for 20 s, resulting in a stable dispersion of CNT in DKPP-QT solution for about 3 weeks. The dispersion was further centrifuged at 3600 rpm to remove any CNT agglomerates larger than about 1 micron before fabricating the TFT device.

The TFT devices were fabricated in a manner similar to that of the Comparative Example. DKPP-QT-stabilized CNT solution was spin coated on the modified wafer substrate at 1000 to 2500 rpm to form the semiconducting CNT layer. The resulting device exhibited a high current on/off ratio of greater than $10^6$, an average mobility of 1.5 cm²/V·s at 3 wt % CNT content, and an average mobility of 1.7 cm²/V·s at 5 wt % CNT content.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A semiconductor composition comprising:
a semiconducting polymer comprising a diketopyrrolopyrrole quarterthiophene moiety; wherein the diketopyrrolopyrrole quarterthiophene is Polymer 1:

Polymer 1

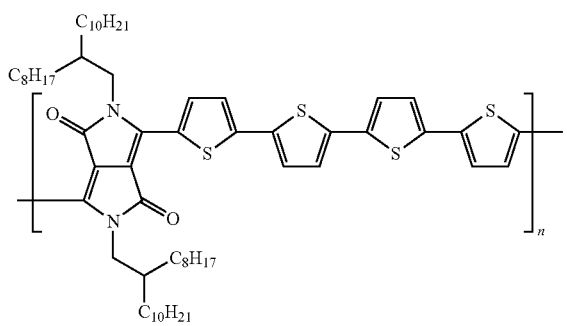

wherein n is an integer representing a number of repeat units and is at least 1; and
a carbon nanotube dispersed into the semiconducting polymer.

2. The semiconductor composition of claim 1, wherein the carbon nanotube is a single-walled carbon nanotube.

3. The semiconductor composition of claim 2, wherein the single-walled carbon nanotube is a semiconducting single-walled carbon nanotube.

4. The semiconductor composition of claim 2, wherein a mixture of conducting carbon nanotubes and semiconducting carbon nanotubes is dispersed in the semiconducting polymer.

5. The semiconductor composition of claim 1, wherein the carbon nanotube has a diameter less than about 1.0 nm.

6. The semiconductor composition of claim 1, wherein the carbon nanotube has a curvature less than about 0.1 micron.

7. The semiconductor composition of claim 1, wherein the carbon nanotube has a length of from about 500 nm to about 2 µm.

8. The semiconductor composition of claim 1, wherein the semiconductor composition has an average field effect mobility of at least about 1.0 cm/Vs.

9. The semiconductor composition of claim 1, wherein the carbon nanotube is present in an amount of from about 0.01 to about 15 wt % based on a total weight of the semiconductor composition.

10. The semiconductor composition of claim 1, wherein the carbon nanotube is present in an amount of from about 0.01 to about 15 wt % based on a total weight of the semiconductor composition.

11. An electronic device comprising a semiconductor layer comprising:
a semiconducting polymer comprising a diketopyrrolopyrrole quarterthiophene moiety; wherein the diketopyrrolopyrrole quarterthiophene is Polymer 1:

Polymer 1

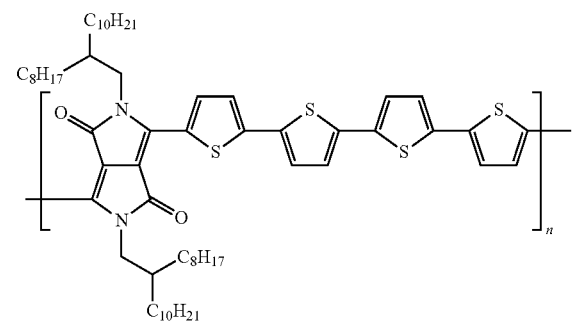

wherein n is an integer representing a number of repeat units and is at least 1; and
a carbon nanotube dispersed in the semiconducting polymer.

12. The electronic device of claim 11, wherein the electronic device is a thin film, transistor device having a high current on./off ratio of at least about $10^6$.

13. The electronic device of claim 11, wherein the electronic device is a thin film transistor device having an average field effect mobility of at least about 1.0 cm/Vs.

14. The electronic device of claim 11, wherein a mixture of conducting single-walled carbon nanotubes and semiconducting single-walled carbon nanotubes are dispersed in the semiconducting polymer.

15. The electronic device of claim 11, wherein the carbon nanotube is present in an amount of from about 0.01 to about 3 wt % based on a total weight of the semiconductor composition.

16. A semiconductor composition comprising:
   a semiconducting polymer comprising a diketopyrrolopyrrole quarterthiophene moiety; wherein the diketopyrrolopyrrole quarterthiophene is Polymer 1 :

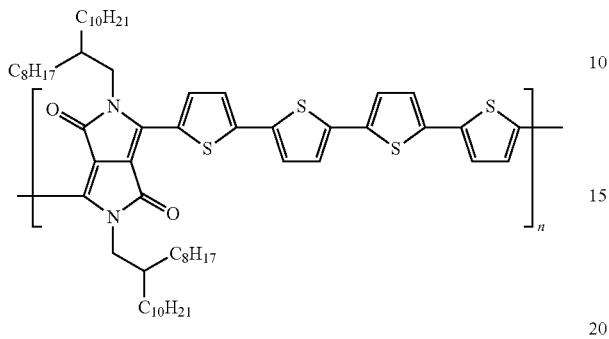

Polymer 1 wherein n is an integer representing a number of repeat units and is at least 1 ;
   a solvent selected from the group consisting of tetrachloroethane, dichlorobenzene, chlorobenzene, chlorotoluene, and a mixture thereof, and
   a carbon nanotube.

17. The semiconductor composition of claim 1, wherein n is an integer from 2 to 5000.

18. The electronic device of claim 11, wherein n is an integer from 2 to 5000.

\* \* \* \* \*